United States Patent
Bjørn

(10) Patent No.: US 9,561,892 B2
(45) Date of Patent: Feb. 7, 2017

(54) AIRTIGHT ENCLOSURE

(71) Applicant: Airmaster A/S, Aars (DK)

(72) Inventor: Erik Bjørn, Nibe (DK)

(73) Assignee: Airmaster A/S, Aars (DK)

( * ) Notice: Subject to any disclaimer, the term of this patent is extended or adjusted under 35 U.S.C. 154(b) by 0 days.

(21) Appl. No.: 14/648,082

(22) PCT Filed: Dec. 2, 2013

(86) PCT No.: PCT/DK2013/050407
§ 371 (c)(1),
(2) Date: May 28, 2015

(87) PCT Pub. No.: WO2014/086366
PCT Pub. Date: Jun. 12, 2014

(65) Prior Publication Data
US 2015/0307252 A1     Oct. 29, 2015

(30) Foreign Application Priority Data

Dec. 3, 2012  (DK) .................................. 2012 70746

(51) Int. Cl.
*B65D 81/18*  (2006.01)
*B65D 6/00*  (2006.01)
(Continued)

(52) U.S. Cl.
CPC .............. *B65D 81/18* (2013.01); *B65D 11/10* (2013.01); *B65D 11/20* (2013.01); *F24F 13/20* (2013.01); *H05K 5/061* (2013.01)

(58) Field of Classification Search
CPC .......... B65D 81/18; B65D 11/10; B65D 11/20
(Continued)

(56) References Cited

U.S. PATENT DOCUMENTS 5,261,199 A * 11/1993 Schmidt ................. A61G 17/00
206/519
5,875,821 A    3/1999 Dumser et al.
(Continued)

FOREIGN PATENT DOCUMENTS

AU         741270 B2    11/2001
DE       43 24 913 C1   11/1994
(Continued)

OTHER PUBLICATIONS

International Search Report for PCT/DK2013/050407 dated Feb. 24, 2014.

*Primary Examiner* — Jeffrey Allen
*Assistant Examiner* — Jennifer Castriotta
(74) *Attorney, Agent, or Firm* — Knobbe Martens Olson & Bear LLP

(57) ABSTRACT

An airtight enclosure comprising a pair of enclosure shells each having a pair of first edges and a pair of second edges extending transversely to the first direction. The first edges are spaced apart by a distance corresponding to the length of the second edges, the second edges are spaced apart by a distance corresponding to the length of the first edges, and the first edges have complementary assemblages for assembling first edges of the enclosure shells, and at least one of the second edges has a groove for accommodating a resilient sealing member in sealing contact with a second edge of the other one of the enclosure shells so that mating edges of each pair of second edge portions allow being assembled within a range of relative positions transverse to their longitudinal direction with the resilient seal or gasket in sealing contact with the mating edges.

4 Claims, 2 Drawing Sheets

(51) Int. Cl.
*H05K 5/06* (2006.01)
*F24F 13/20* (2006.01)

(58) Field of Classification Search
USPC .... 220/4.24, 795, 345.6, 806, 378, 681, 682
See application file for complete search history.

(56) References Cited

U.S. PATENT DOCUMENTS 6,296,284 B1 * 10/2001 Weischedel ........ B60H 1/00528
220/345.3
2004/0188120 A1 9/2004 Komatsu et al.

FOREIGN PATENT DOCUMENTS

| DE | 103 51 710 A1 | 5/2004 |
| DE | 10 2009 008 037 A1 | 9/2010 |
| JP | 2003-264379 A | 9/2003 |
| JP | 2004-072876 A | 3/2004 |
| JP | 2010-118425 A | 5/2010 |

* cited by examiner

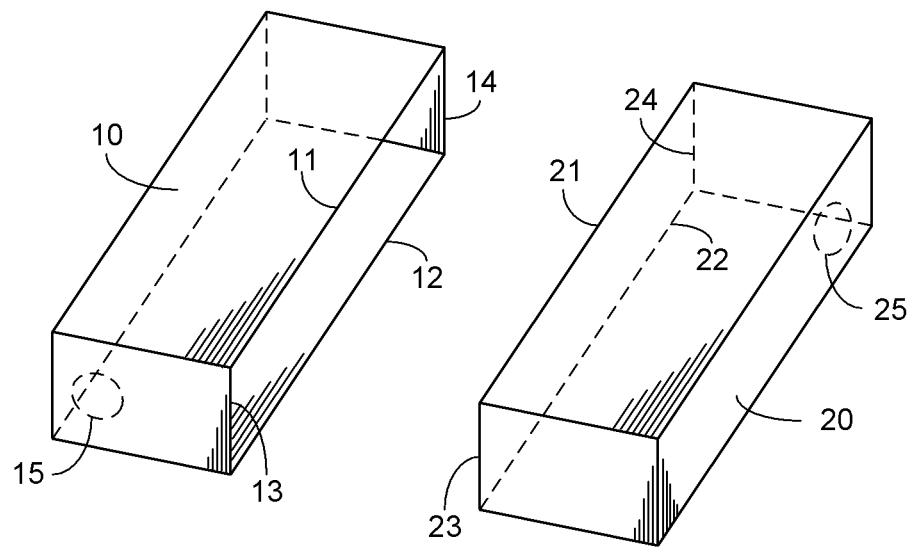
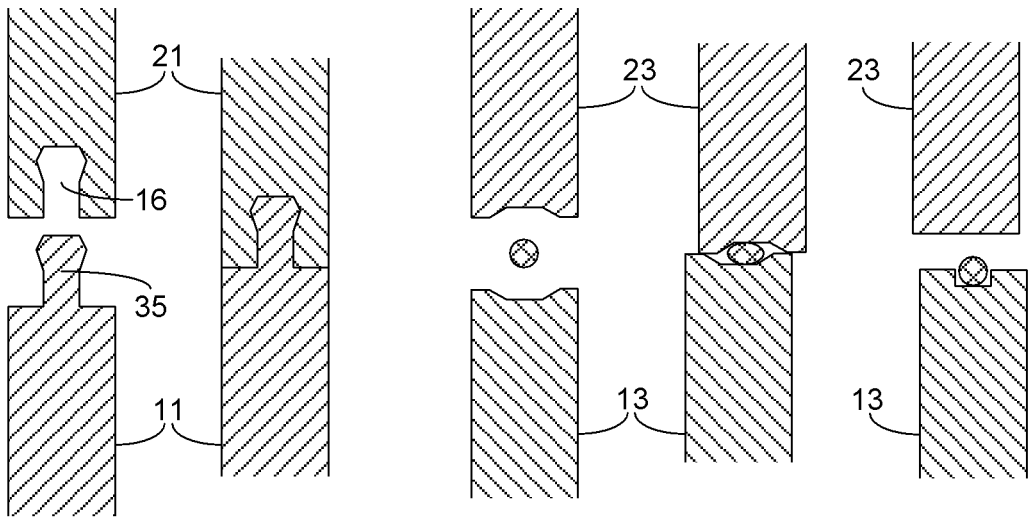
Fig. 1
Fig. 2  Fig. 3  Fig. 4  Fig. 5  Fig. 6

AIRTIGHT ENCLOSURE

CROSS REFERENCE TO RELATED APPLICATIONS

This application is a U.S. National Phase Application of PCT International Application Number PCT/DK2013/050407, filed on Dec. 2, 2013, designating the United States of America and published in the English language, which is an International Application of and claims the benefit of priority to Danish Patent Application No. PA 2012 70746, filed on Dec. 3, 2012. The disclosures of the above-referenced applications are hereby expressly incorporated by reference in their entireties.

FIELD OF THE INVENTION

The invention relates to airtight enclosures formed by two or more enclosure shells, e.g. for accommodating a ventilation system such as a ventilation system with energy recovery.

BACKGROUND OF THE INVENTION

Ventilation systems such as ventilation systems with energy recovery require airtight enclosures for accommodating the ventilation system. If the enclosure is not airtight but has leaks air may be drawn into the system or escape from the system through leaks in the enclosure whereby the efficiency of the system will be reduced. Leaked air may cause undesired effects on the functionality of the unit, e.g. due to increased energy use for air transport, pressure imbalance in ventilated rooms, decreased efficiency of energy recovery, incorrect measurements by internal sensors and ensuing control errors, formation of condensate in critical parts of the unit, and whistling or hissing noises.

Components and modules of a system according to the invention will typically be accommodated in an enclosure composed of two or more enclosure shells that are assembled along mating edges to form a closed airtight enclosure. Preferred materials for the enclosure shells are expanded polypropylene, EPP, and expanded polystyrene, EPS. Systems for domestic use may be accommodated in enclosures well above one meter in a long direction, while dimensions in a short direction can be a few tens of centimeters. With rectangular enclosures this means that long edges of the shells are separated by a distance corresponding to the length of the short edges, while short edges of the shells are separated by a distance corresponding to the length of the long edges. Manufacturing tolerances are mainly proportional to dimensions, and since the long edges of the shells are a relatively short distance apart, this in turn means that the distance between opposed long edges of a shell is manufactured to relatively small tolerances, and further, since the short edges of the shells are a relatively long distance apart, this in turn means that the distance between opposed short edges of a shell is manufactured to relatively large tolerances. This difference in tolerances results in correspondingly different requirements to the mating surfaces of edges to be joined in order to ensure an airtight enclosure when the shells have been assembled.

It is therefore desirable to have an enclosure to be assembled from two or more enclosure parts or enclosure shells to form an airtight enclosure where tolerances are absorbed in the structure of the enclosure parts themselves without having to add supplementary tightening material and without any need of additional tooling of the shells. Furthermore, it is desirable that the combined shells are self-supporting without any need for gluing the parts permanently together, and that it is possible to disassemble and reassemble the parts non-destructively and without loss of performance in case of modification or maintenance and repair of the system.

SUMMARY OF THE INVENTION

The invention provides an enclosure comprising a pair of enclosure shells, each enclosure shell having a pair of first edges extending in a first direction and a pair of second edges extending in a second direction transversely to the first direction, wherein the pair of first edges are spaced part by a distance corresponding to the length of the pair of second edges, the pair of second edges are spaced part by a distance corresponding to the length of the pair of first edges, and wherein the pair of first edges have complementary assembling means comprising a tongue and a groove, respectively, for assembling first edges of respective ones of the enclosure shells, and at least one of the pair of second edges has a groove for accommodating a resilient sealing member in sealing contact with a second edge of the other one of the pair of enclosure shells.

This is advantageous when the pairs of first edges are relatively long compared to the pairs of second edges since manufacturing tolerances are typically proportional to dimensions. If, due to e.g. manufacturing tolerances, the pair of first edges on one enclosure shell are longer than the pair of first edges on the other enclosure shell, such difference in length is of no, or only minor, importance to the pairs of first (longer) edges since they have a tongue-and-groove structure for joining the pairs of first edges. The pairs of second (short) edges are separated by a distance corresponding to the length of the pairs of first (long) edges, and due to manufacturing tolerances the pairs of second edges on one enclosure shell are separated by a longer distance than the pairs of second edges on the other enclosure shell. Such difference in distance between the pairs of second edges is then absorbed due to the structure of the pairs of second edges.

BRIEF DESCRIPTION OF THE DRAWINGS

FIG. 1 shows a pair of enclosure shells to be assembled to an airtight enclosure according to the invention, FIG. 2 shows a cross section through edge portions of first edges on respective ones of a pair of enclosure shells to be joined, FIG. 3 shows the edge portions in FIG. 2 joined, FIG. 4 shows a cross section through edge portions of second edges on respective ones of a pair of enclosure shells to be joined, FIG. 5 shows the edge portions in FIG. 4 joined, FIG. 6 shows a cross section through second edge portions of an alternative version of second edges on respective ones of a pair of enclosure shells to be joined.

DETAILED DESCRIPTION OF THE INVENTION

Figure 7:
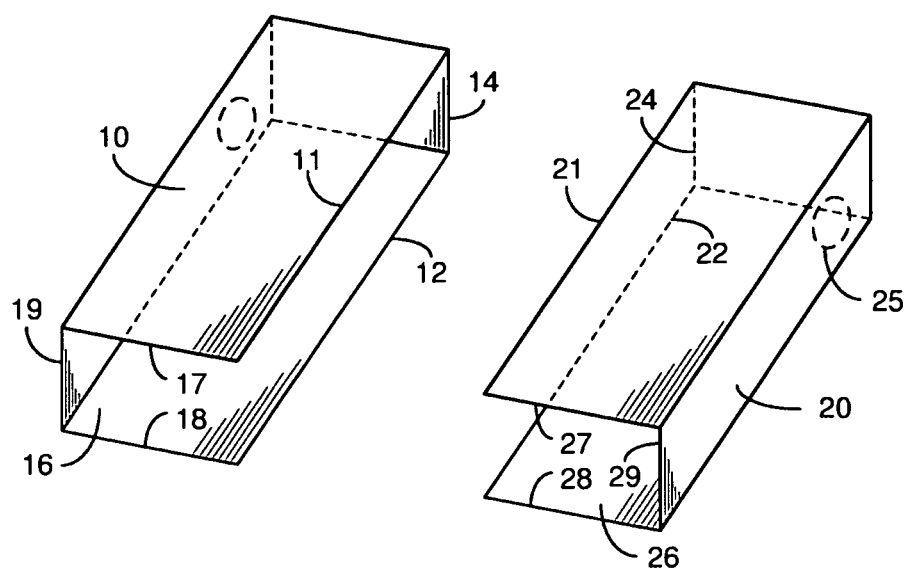
FIG. 7 shows the pair of enclosure shells in FIG. 1 where an enclosure wall is missing.

In FIG. 1 are shown two enclosure shells 10, 20 each having a pair of first edges 11, 12 and 21, 22 respectively extending in a first direction, and a pair of second edges 13, 14 and 23, 24 respectively extending in a second direction transverse to the first direction. The enclosure shells 10, 20 each have an open side facing towards the other and they are to be assembled to an airtight enclosure by joining the pairs of first edges 11, 12 and 21, 22 and the pairs of second edges 13, 14 and 23, 24. Openings 15, 25 are provided for inlet and outlet of air to and from a ventilation system with or without energy recovery to be accommodated in the enclosure.

In FIGS. 2 and 3 are shown cross sections through first edge portions 11 and 21 of respective ones of a pair of enclosure shells. The first edges have complementary means for assembling. In the shown embodiment one of the first edges has a longitudinal tongue 35 and the other edge has a corresponding longitudinal groove 16. The tongue 35 and the groove 16 can have plane or parallel side walls, or a dovetail shape with a bead as shown, whereby hold is improved. An opposed pair of mating first edges is separated from the shown pair by a distance corresponding to the length of a second edge. When the first edges are assembled the mating surfaces of the edges will make an airtight seal due to their mating geometry.

In FIGS. 4 and 5 is shown cross sections through second edge portions 13 and 23 of respective ones of a pair of enclosure shells. The second edges extend transversely to the first edges of the enclosure shells. One or both of the second edges has a relatively wide groove in which a resilient seal or gasket. When the second edges are assembled the mating surfaces of the edges will compress the resilient seal or gasket and make an airtight seal. The groove or grooves is/are somewhat wider than the resilient seal or gasket so as to accommodate for the tolerance in the distance between edges of a pair of second edges due to e.g. tolerances. An opposed pair of second edges is separated from the shown pair by a distance corresponding to the length of a first edge.

In FIG. 6 is shown a cross section through second edge portions of an alternative version of second edges on respective ones of a pair of enclosure shells to be joined. The edge 13 has a groove in which a resilient seal or gasket, while the edge 23 has no groove. When the second edges are assembled the resilient seal or gasket will be compressed and make an airtight seal.

FIGS. 5 and 6 illustrate two pairs of second edge portions 13 and 23 having different relative positions due to manufacturing tolerances. The opposed, mating edges of each pair of second edge portions 13 and 23 allow being assembled within a range of relative positions transverse to their longitudinal direction with the resilient seal or gasket between the mating edges. In both cases the differences in relative positions are absorbed and an airtight seal is achieved.

In order for a groove to be able to receive a tongue also in cases where, due to manufacturing tolerances, the tongue has a shorter than nominal length and the groove has a longer than nominal length, the groove will advantageously have a length which is greater than the length of the tongue. In order to ensure airtightness a resilient sealing member or substance can then be placed at one or both ends of the groove for sealing contact with end surfaces of a tongue when assembled.

FIG. 7 shows the pair of enclosure shells 10, 20 in FIG. 1 where an enclosure wall of each enclosure shell is missing leaving an open face 16 and 26, respectively, each with three edges 17, 18, 19 and 27, 28, 29. Similar to the pair of enclosure shells in FIG. 1 the pair of enclosure shells 10, 20 in FIG. 7 are to be assembled by joining the pairs of first edges 11, 12 and 21, 22 and the second edges 14 and 24. Like each of the enclosure shells 10, 20 in FIG. 1 the assembled pair of enclosure shells in FIG. 7 has an open face consisting of the combination of the open faces 16 and 26. The thus assembled enclosure shells 10, may then be assembled with a third (not shown) enclosure shell similar to what is shown and described in relation to FIG. 1 to form an airtight enclosure. Due to manufacturing tolerances the pairs of first edges 11, 12 and 21, 22 can have different lengths, and the pair of edges 17, 18 may therefore be correspondingly offset from the pair of edges 27, 28 and form a step. According to the invention this is accommodated for by providing the edges 17, 18 and 27, 28 with a resilient seal or gasket e.g. like what is shown in FIGS. 4-6 which is capable of sealing against the corresponding edges of the third enclosure shell in their entire length including a possible step. The "third" edges 19, 29 will then be assembled with the corresponding edges of the third enclosure shell with a tongue-and-groove structure as described in connection with FIGS. 2 and 3.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible or advantageous.

The invention claimed is:

1. An airtight enclosure comprising a pair of enclosure shells, each enclosure shell having:
    a pair of first edges, each first edge having a first length and extending in a first direction and
    a pair of second edges, each second edge having a second length shorter than the first length and extending in a second direction transverse to the first direction,
    wherein
    the pair of first edges are spaced apart by a distance corresponding to the second length,
    the pair of second edges are spaced part by a distance corresponding to the first length,
    and wherein
    the pairs of first edges have complementary assemblages comprising a tongue and a groove, respectively, with mating geometries for assembling first edges of respective ones of the enclosure shells in sealing contact, and
    at least one second edge of the pair of second edges has a groove accommodating a resilient sealing member in sealing contact with a second edge of the other one of the pair of enclosure shells so that mating edges of each pair of second edge portions allow being assembled in multiple distinct positions within a range of relative positions transverse to the first direction with the resilient sealing member in sealing contact with the mating edges,
    wherein the complementary assemblages of the pairs of first edges are different than the mating edges of each pair of second edge portions.

2. The airtight enclosure according to claim 1 wherein the tongue and the groove have a dovetail shape.

3. The airtight enclosure according to claim 1 wherein the grooves are longer than the tongues, and the grooves have a resilient sealing member at one or both ends of the groove for sealing contact with end surfaces of a tongue when assembled.

4. The airtight enclosure according to claim 1 wherein the pair of enclosure shells are made of expanded polypropylene, EPP, or expanded polystyrene, EPS.

\* \* \* \* \*